United States Patent
Chudzik et al.

(10) Patent No.: US 7,871,933 B2
(45) Date of Patent: Jan. 18, 2011

(54) COMBINED STEPPER AND DEPOSITION TOOL

(75) Inventors: Michael P. Chudzik, Danbury, CT (US); Joseph F. Shepard, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 881 days.

(21) Appl. No.: 11/164,684

(22) Filed: Dec. 1, 2005

(65) Prior Publication Data

US 2007/0128859 A1 Jun. 7, 2007

(51) Int. Cl.
*H01L 21/311* (2006.01)
(52) U.S. Cl. .................. 438/702; 438/671; 438/700; 438/703; 438/708
(58) Field of Classification Search .......... 438/671, 438/700, 702, 703, 707, 708
See application file for complete search history.

(56) References Cited

U.S. PATENT DOCUMENTS

| | | | |
|---|---|---|---|
| 4,283,482 A | | 8/1981 | Hattori et al. |
| 5,310,624 A | | 5/1994 | Ehrlich |
| 5,413,664 A | | 5/1995 | Yagi et al. |
| 5,714,798 A | | 2/1998 | Armacost et al. |
| 6,610,552 B2 * | | 8/2003 | Fujimori et al. ............ 438/22 |
| 2002/0096490 A1 * | | 7/2002 | Yu .......................... 216/41 |
| 2004/0135226 A1 * | | 7/2004 | Yoshimura et al. .......... 257/499 |
| 2005/0017624 A1 * | | 1/2005 | Novet et al. ............... 313/311 |
| 2005/0133476 A1 * | | 6/2005 | Islam et al. ................ 216/2 |
| 2006/0065628 A1 * | | 3/2006 | Vahedi et al. .............. 216/67 |
| 2006/0067009 A1 * | | 3/2006 | Cyrille et al. ............. 360/324.1 |
| 2006/0091780 A1 * | | 5/2006 | Minami ..................... 313/495 |
| 2006/0175084 A1 * | | 8/2006 | Okamoto et al. ............ 174/262 |
| 2006/0248967 A1 * | | 11/2006 | Tsukuda et al. ............. 73/865.9 |
| 2007/0085459 A1 * | | 4/2007 | Hudspeth et al. ........... 313/309 |
| 2007/0127006 A1 * | | 6/2007 | Shibazaki ................... 355/72 |
| 2007/0298609 A1 * | | 12/2007 | Yakobson et al. ........... 438/653 |
| 2008/0006888 A1 * | | 1/2008 | Yun et al. ................... 257/414 |
| 2008/0227030 A1 * | | 9/2008 | Moreau et al. ............ 430/281.1 |

FOREIGN PATENT DOCUMENTS

| | | |
|---|---|---|
| GB | 2 156 834 | 10/1985 |
| JP | 07 254556 | 10/1995 |
| JP | 07 305027 | 11/1995 |
| JP | 2000 165996 | 6/2000 |

OTHER PUBLICATIONS

J. J. Cumo, et al., "Low-Temperature Surface Discriminating Deposition Process", IBM TDB, vol. 11, No. 3, 1968, p. 253.
International Search Report and the Written Opinion of the International Searching Authority, International Application No. PCT/EP2006/068188.

\* cited by examiner

*Primary Examiner*—Zandra Smith
*Assistant Examiner*—Jae Lee
(74) *Attorney, Agent, or Firm*—Lisa Jaklitsch; Katherine S. Brown

(57) ABSTRACT

A stepper is combined with hardware that deposits a layer of material in the course of forming an integrated circuit, thus performing the deposition, patterning and cleaning without exposing the wafer to a transfer between tools and combining the function of three tools in a composite tool. The pattern-defining material is removed by the application of UV light through the mask of the stepper, thereby eliminating the bake and development steps of the prior art method. Similarly, a flood exposure of UV eliminates the cleaning steps of the prior art method.

2 Claims, 3 Drawing Sheets

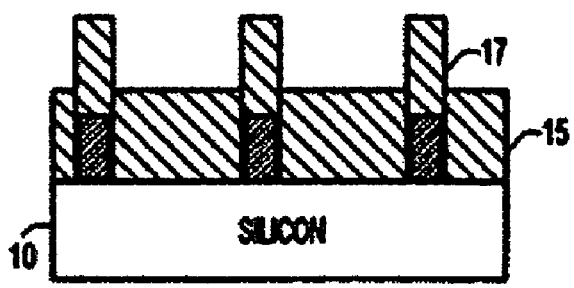
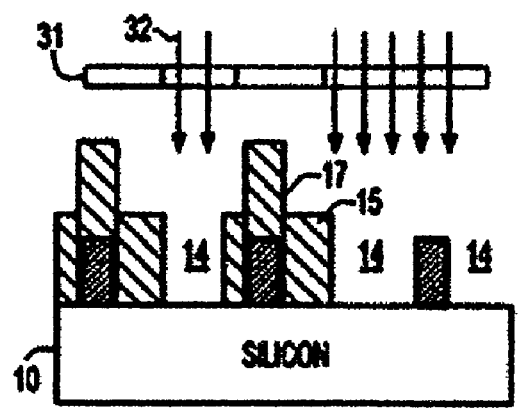
FIG. 4  FIG. 5
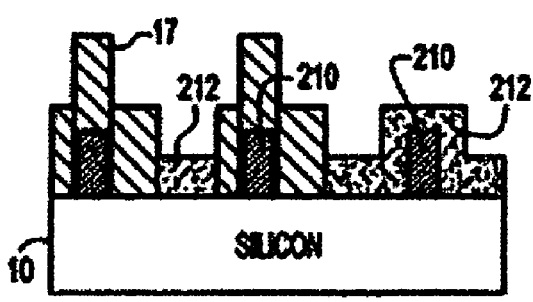
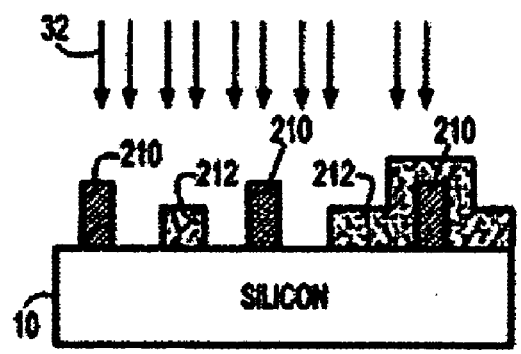
FIG. 6  FIG. 7

COMBINED STEPPER AND DEPOSITION TOOL

TECHNICAL FIELD

The field of the invention is that of fabricating integrated circuits (and micromachining), in particular depositing a patterned layer of material in the course of the formation of a structure.

BACKGROUND OF THE INVENTION

The standard method of forming an integrated circuit consists basically of defining a pattern lithographically in a photosensitive material and then removing or depositing a layer of the integrated circuit according to the pattern.

The lithography is performed in a composite tool that combines the steps of applying the photoresist, baking it, and developing it in a first unit and the step of exposing the resist to photons in a second unit. The two units are combined in a common envelope, referred to as a combined tool, so that transfer between the units does not expose the wafer to the ambient atmosphere in the clean room of the fab.

The process requires a deposition tool, typically using a type of chemical vapor deposition to deposit the unpatterned layer material and an ashing tool to remove residues of the photoresist, for a total of three tools.

A clean room has a highly controlled ambient atmosphere that is nevertheless more contaminated with foreign matter than the atmosphere within the composite lithography tool.

A simplified list of the steps on the material deposition and pattern process is set forth in Table I.

TABLE I

Blanket material deposition
Resist coat
Softbake Resist
Wafer transfer to Stepper
Pattern Exposure
Wafer transfer from stepper
Hardbake Resist
Develop Resist
Etch Removal of Deposited Material
Wafer Transfer to Ashing Tool
Ash Resist
Post Removal Clean In many integrated circuits using advanced technology, this sequence may be repeated up to 20 times. Integrated circuits using embedded DRAM modules require even more steps.

The manufacture of integrated circuits is a highly competitive field and manufacturers are constantly seeking to reduce costs.

The art could benefit from a process for forming a patterned layer that requires fewer steps and/or fewer tools than the current process.

SUMMARY OF THE INVENTION

The invention relates to a combined apparatus for forming a patterned layer of a structure material on a workpiece, incorporating within a common enclosure a deposition module for depositing and removing material and an exposure module for defining a pattern in a photosensitive pattern material.

A feature of the invention is that the material removal step in the patterning of a layer of pattern material is performed in the same chamber as the exposure of the material.

Another feature of the invention is that the patterning process is effected by exposure to particles (photons or electrons), which remove the pattern-defining material as a vapor.

BRIEF DESCRIPTION OF THE DRAWINGS

FIGS. 2-7 show in cross section steps in forming two layers of a structure.

DETAILED DESCRIPTION

Figure 1:
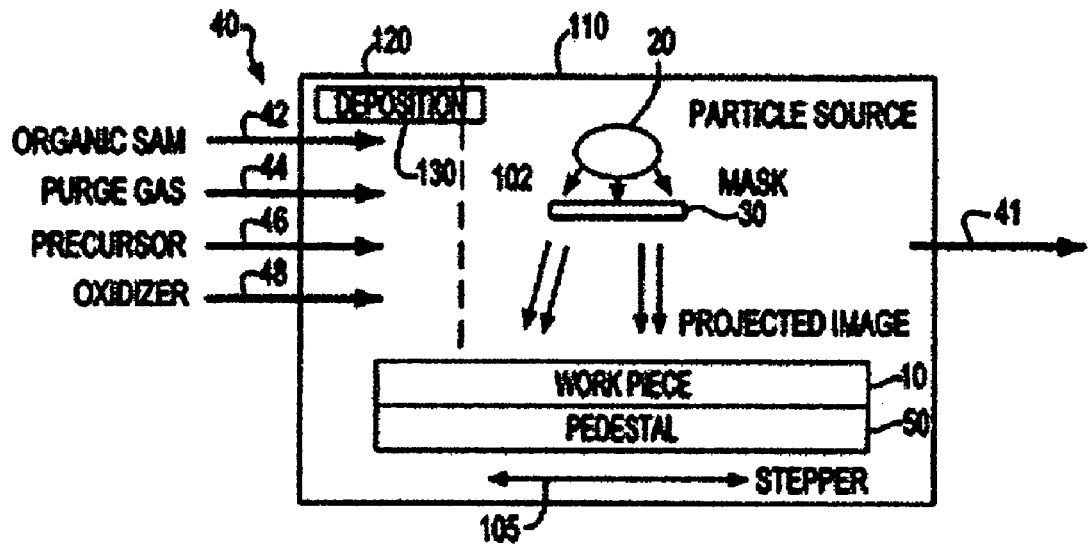
FIG. 1 shows in partially schematic, partially pictorial fashion, a simplified diagram of an apparatus for practicing the invention.

FIG. 1 shows a simplified diagram of an apparatus 100 for practicing the invention, in which the right side of the Figure, denoted with numeral 110 is an exposure module that performs the functions of a stepper, generating a beam of ultraviolet photons in source 20 that passes through mask 30, which carries the pattern to be imposed on the workpiece 10, illustratively a semiconductor wafer that will contain a set of integrated circuits (ICs). Workpiece 10 is carried by pedestal 50 that is moved as indicated by arrow 105 in a conventional fashion to place a particular IC under the patterned beam.

On the left side of the Figure, deposition module 120 has a set of input gas lines. Line 42 carries the Self-Assembled siloxane-based organic Material (SAM) that adsorbs on the surface of the wafer to form an unpatterned film. Alternatively, line 44 may carry a similar deposition inhibitor material that has the property that it vaporizes upon exposure to electrons or photons. Line 44 carries a purge gas, such as argon or nitrogen. Line(s) 46 carry the precursor(s) of the structure material that will be deposited in apertures to be formed in the SAM by the UV. Line 48 carries an oxidizer which is used in the deposition process.

Dashed line 102 denotes schematically an optional separation between chambers that perform the functions of deposition and particle exposure.

Figures 2, 3:
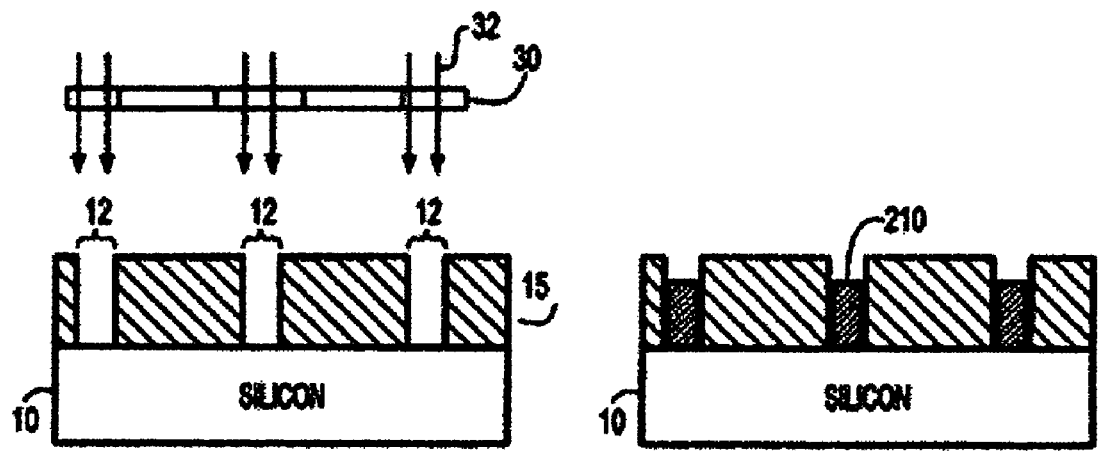

In operation, as shown in FIG. 2, a wafer is introduced to the deposition module and receives a film of SAM 15, referred to generally as a pattern material, that adsorbs evenly across the wafer surface. The film 15 is patterned by exposure to UV radiation 32 from source 20, patterned by mask 30. The effect of this exposure is to remove the SAM that is exposed to the UV. The exposed material becomes volatile and exits along line 41, leaving a patterned layer containing a set of apertures 12 that are to be filled with a structure material that will be part of the IC, at least temporarily, e.g. the structure material may be a conductor in the back end of the integrated circuit.

Illustratively, the filling mechanism is Atomic Layer Deposition (ALD), the apparatus for which is represented schematically by block 130 in Deposition Module 120. A criterion for selecting the deposition method and deposited material is that it selectively fills the exposed apertures 12 without adhering to the SAM. SAM 15 has the property that it is hydrophobic, and the material deposited by the ALD process is required to have the property that it does not adhere to hydrophobic materials. This is a general rule with ALD and thus there are few restrictions in materials to be deposited. Consequently, the ALD deposition is selective and the problem of removing unwanted material from the unpatterned portion of the SAM does not arise. Alternatively, Chemical Vapor Deposition (CVD) may be used, if it is preferred in a particular application.

When the apertures 12 have been filled with a first material 210, as shown in FIG. 3, the remaining SAM material can be removed by a flood exposure of UV. Alternatively, in the example illustrated in FIG. 4, a second layer of SAM 17 is deposited and patterned by a second mask to cover the first deposited material 210. The step of FIG. 4 may be used in the case where more than one material is desired on the same level. However, this step may be performed before any later step and any number or repeats may be performed.

FIG. 5 shows the result of a second patterning of SAM layer 15 with UV 32 patterned by mask 31 to open apertures 14 in the first layer of SAM 15.

A second layer of structure material 212 is deposited by ALD as shown in FIG. 6, illustratively with a different thickness from layer 210. The structures formed from layer 210 on the left side of the figure, being protected by SAM 17 are unchanged, while the stub of material 210 on the right side is covered by a layer of material 212.

FIG. 7 shows the final structure after a clean up flood exposure of UV 32, with separate blocks of material 210 and 212 on the left and a composite structure of both materials on the right. Optionally, a layer of dielectric may be deposited by CVD and planarized by chemical-mechanical polishing. The dielectric may be deposited in the invented combined tool using conventional precursors or in a specialized CVD tool and the planarization may be performed in a conventional CMP tool. This option may be used if more than one layer is to be formed and if a planar surface is desired for the next layer.

Figure 8:
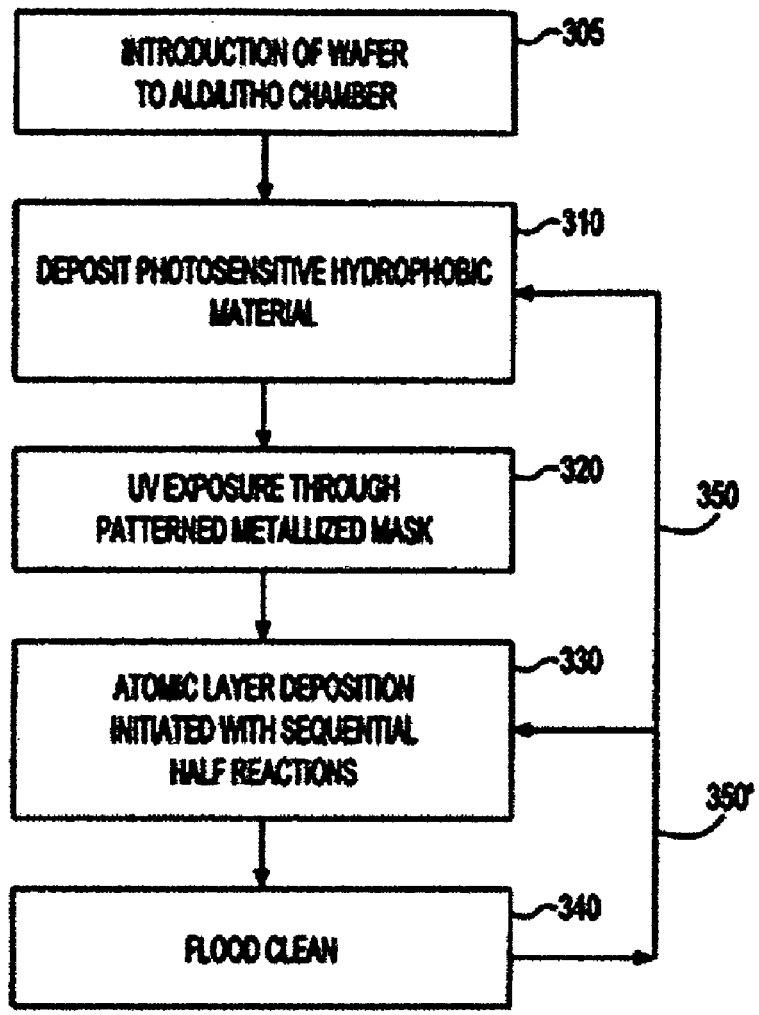
FIG. 8 shows a block diagram of the apparatus.
Figure 9:
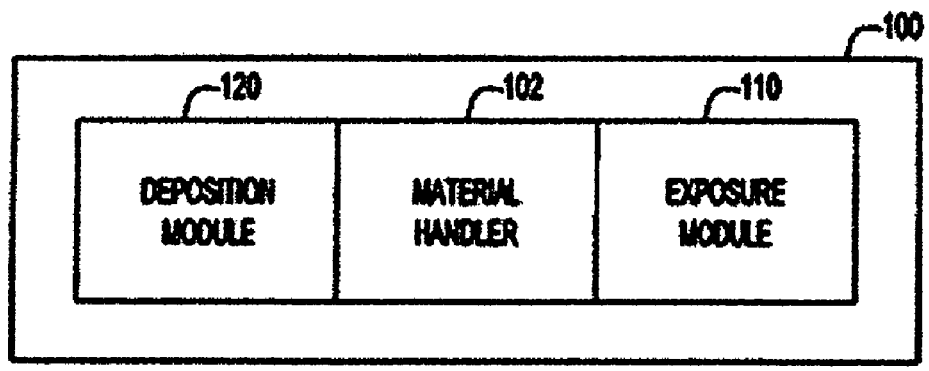
FIG. 9 depicts an apparatus for practicing an embodiment of the invention having separate deposition and exposure chambers.

FIG. 8 shows a flow chart of the process illustrated in FIGS. 2 through 7. The wafer is inserted in the tool in step 305, either a separate deposition chamber as illustrated in FIGS. 1 and 9 or a combined chamber that contains apparatus for performing both functions of deposition and exposure.

A first layer of SAM is deposited in step 310.
The SAM is exposed by UV through a mask in step 320.
A first layer of ALD material is put down in step 330.
Optionally, as shown by line 350, a second layer of SAM can be put down at this time without removing the first layer, returning to step 310.

As an alternative, the first layer can be removed by a flood exposure of UV in step 340 and the path denoted by line 350' can be taken.

The process of depositing a patterned layer according to the invention is summarized in TABLE II.

TABLE II

Deposition of (siloxane-based) deposition inhibitor blanket coat
Pattern definition and removal of inhibitor by UV light
Selective deposition in open areas
Flood UV exposure to remove inhibitor Those skilled in the art will appreciate that the prior art process of TABLE I requires nine steps and three tools (stepper, deposition, and ashing), while the process according to the invention requires only four steps in a single tool.

An alternative representation of the tool is shown in FIG. 9, highlighting the physical relationship between the deposition module and the exposure module. Block 100 in FIG. 9 represents the overall tool structure of the tool, which may include all components located in close proximity or may include physically separate chambers that have different atmospheres. Incorporating all components in a single enclosure would save cost.

In a particular example, the optics of the stepper must be extremely precise and even a thin coating of material from the SAM or the structure material 210 may alter the focus of the UV beam. It may, therefore, be advisable to reduce this possibility by isolating the deposition environment from the patterning environment using separate chambers for each function.

Referring again to FIG. 9, block 102, labeled material handler, represents the conventional robotic handler that receives the wafer from the transfer module circulating in the fab and transfers it between the deposition module 120 (also referred to as the means for depositing a structure material) and the exposure module 110 as required by the process being carried out.

The patterning of the pattern material (the SAM, which embodies the pattern) may be carried out by an electron beam (direct-write or projection lithography) in which case the pattern unit may be a deflection unit for controllably deflecting the beam.

Wafer 10 has been referred to as a workpiece because the apparatus can be applied to micromachining of many types and is not confined to integrated circuits.

While the invention has been described in terms of a single preferred embodiment, those skilled in the art will recognize that the invention can be practiced in various versions within the spirit and scope of the following claims.

What is claimed is:

1. A method of forming structure on a workpiece comprising the steps of:
   first loading said workpiece into a chamber, said chamber having a controlled atmosphere including a temperature and a pressure;
   in said controlled atmosphere
   i) depositing an unpatterned film on a surface of said workpiece, said film formed of a hydrophobic photosensitive material;
   ii) creating a pattern of apertures through said film by exposing said film to a patterned beam of electrons or photons wherein exposed portions of said film volatilize upon such exposure, said patterned beam defined by passing a first beam of electrons or photons through a patterning unit;
   iii) depositing structural material within said apertures, then prior to step iv a) depositing a unpatterned second film over said workpiece, said film formed of a hydrophobic photosensitive material; b) creating a pattern of second apertures by exposing said second film to a second patterned beam of electrons or photons wherein exposed portions of said film volatilize upon such exposure, said second patterned beam defined by passing a first beam of electrons or photons through a second patterning unit and c) depositing structural material within said second apertures, and
   iv) vaporizing remaining portions of said film by flooding said workpiece with said first beam; and after step iv
   removing said workpiece from said chamber.

2. The method according to claim 1 further comprising:
   prior to said removing step, performing in said chamber at least a second time
   depositing an unpatterned film on a surface of said workpiece, said film formed of a hydrophobic photosensitive material;
   creating a pattern of apertures through said film by exposing said film to a patterned beam of electrons or photons wherein exposed portions of said film volatilize upon such exposure, said patterned beam defined by passing a first beam of electrons or photons through a patterning unit;
   depositing structural material within said apertures, and
   vaporizing remaining portions of said film by flooding said workpiece with said first beam.

* * * * *